(12) United States Patent
Kim et al.

(10) Patent No.: US 11,075,147 B2
(45) Date of Patent: Jul. 27, 2021

(54) STACKED DIE SEMICONDUCTOR PACKAGE

(71) Applicant: Texas Instruments Incorporated, Dallas, TX (US)

(72) Inventors: Woochan Kim, San Jose, CA (US); Vivek Arora, San Jose, CA (US); Ken Pham, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 12 days.

(21) Appl. No.: 16/504,816

(22) Filed: Jul. 8, 2019

(65) Prior Publication Data
US 2021/0013138 A1 Jan. 14, 2021

(51) Int. Cl.
| | | |
|---|---|---|
| H01L 23/495 | (2006.01) | |
| H01L 23/31 | (2006.01) | |
| H01L 21/56 | (2006.01) | |
| H01L 23/64 | (2006.01) | |
| H01L 21/48 | (2006.01) | |

(52) U.S. Cl.
CPC .... *H01L 23/49575* (2013.01); *H01L 21/4825* (2013.01); *H01L 21/565* (2013.01); *H01L 23/3114* (2013.01); *H01L 23/4952* (2013.01); *H01L 23/49513* (2013.01); *H01L 23/49527* (2013.01); *H01L 23/49562* (2013.01); *H01L 23/645* (2013.01)

(58) Field of Classification Search
CPC ........... H01L 23/49575; H01L 23/3114; H01L 23/49513; H01L 21/4825; H01L 23/49527; H01L 23/49562; H01L 23/4952; H01L 21/565; H01L 23/645
See application file for complete search history.

(56) References Cited

U.S. PATENT DOCUMENTS

| | | | | |
|---|---|---|---|---|
| 6,313,527 | B1 * | 11/2001 | Han | H01L 23/49575 257/723 |
| 9,761,568 | B2 | 9/2017 | Fang et al. | |
| 2002/0074637 | A1 | 6/2002 | MacFarland | |
| 2008/0006948 | A1 * | 1/2008 | Wu | H01L 25/50 257/778 |
| 2013/0285260 | A1 * | 10/2013 | Denison | H01L 23/4952 257/777 |
| 2015/0279811 | A1 * | 10/2015 | Kim | H01L 21/561 438/113 |
| 2017/0025328 | A1 * | 1/2017 | Liu | H01L 23/49861 |

* cited by examiner

*Primary Examiner* — Karen Kusumakar
*Assistant Examiner* — Adam S Bowen
(74) *Attorney, Agent, or Firm* — Ronald O. Neerings; Charles A. Brill; Frank D. Cimino

(57) ABSTRACT

A stacked die semiconductor package includes a leadframe including a die pad and lead terminals on at least two sides of the die pad, a top die having circuitry coupled to bond pads, and bottom die having a back side that is attached by die attach material to the die pad and a top side having at least one redistribution layer (RDL) over and coupled to a top metal level including connections to input/output (IO) nodes on the top metal level. The RDL provides a metal pattern including wirebond pads that match locations of the bond pads of the top die. The bond pads on the top die are flip-chip attached to the wirebond pads of the bottom die, and the bond wires are positioned between the wirebond pads and the lead terminals.

19 Claims, 3 Drawing Sheets

STACKED DIE SEMICONDUCTOR PACKAGE

FIELD

This Disclosure relates to stacked die multichip semiconductor packages.

BACKGROUND

A variety of semiconductor chip packages are known that provide support for an integrated circuit chip (IC) or semiconductor die and associated bond wires, provide protection from the environment, and enable surface mounting of the die to and interconnection to a printed circuit board (PCB). One conventional package configuration includes a leadframe having a die pad and surrounding leads.

Some packaged semiconductor devices comprise stacked die devices. Stacked die semiconductor devices are common for some power devices. One known arrangement stacks a control IC on a power field effect transistor (FET) to enhance the power density. The control IC may be mounted on the source pad of a lateral FET using a thermally conductive die attach material, and wire bonds (e.g., comprising an Au or a Cu wire) can be used to make an interconnection between the FET and control IC die.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects include a stacked die semiconductor packaged device (stacked die semiconductor package) that includes electrical routing on a bottom semiconductor die provided by at least one redistribution layer (RDL), with flip-chip mounting of the top semiconductor die on the wirebond pads of an RDL(s) on the bottom semiconductor die, where the die-to-die interconnections are made by flip-chip bumps to wirebond pads. By removing the bond wires between the respective stacked die, the parasitic inductance is reduced, so that disclosed stacked die semiconductor packages applied to power devices enable power stage products to provide a power density increase. Also, the packaging cost is reduced by reducing the bond wire count, and the package area is also reduced.

Disclosed aspects include a stacked die semiconductor package that includes a leadframe including a die pad and lead terminals on at least two sides of the die pad, a top die having circuitry coupled to bond pads, and bottom die having a back side that is attached by a die attach material to the die pad and a top side having at least one RDL over and coupled to a top metal level including connections to input/output (IO) nodes on the top metal level. The RDL provides a metal pattern including wirebond pads that match locations of the bond pads of the top die. The bond pads on the top die are flip-chip attached to the wirebond pads of the bottom die, and the bond wires are positioned between the wirebond pads and the lead terminals.

BRIEF DESCRIPTION OF THE DRAWINGS

Reference will now be made to the accompanying drawings, which are not necessarily drawn to scale, wherein.

DETAILED DESCRIPTION

Figure 1:
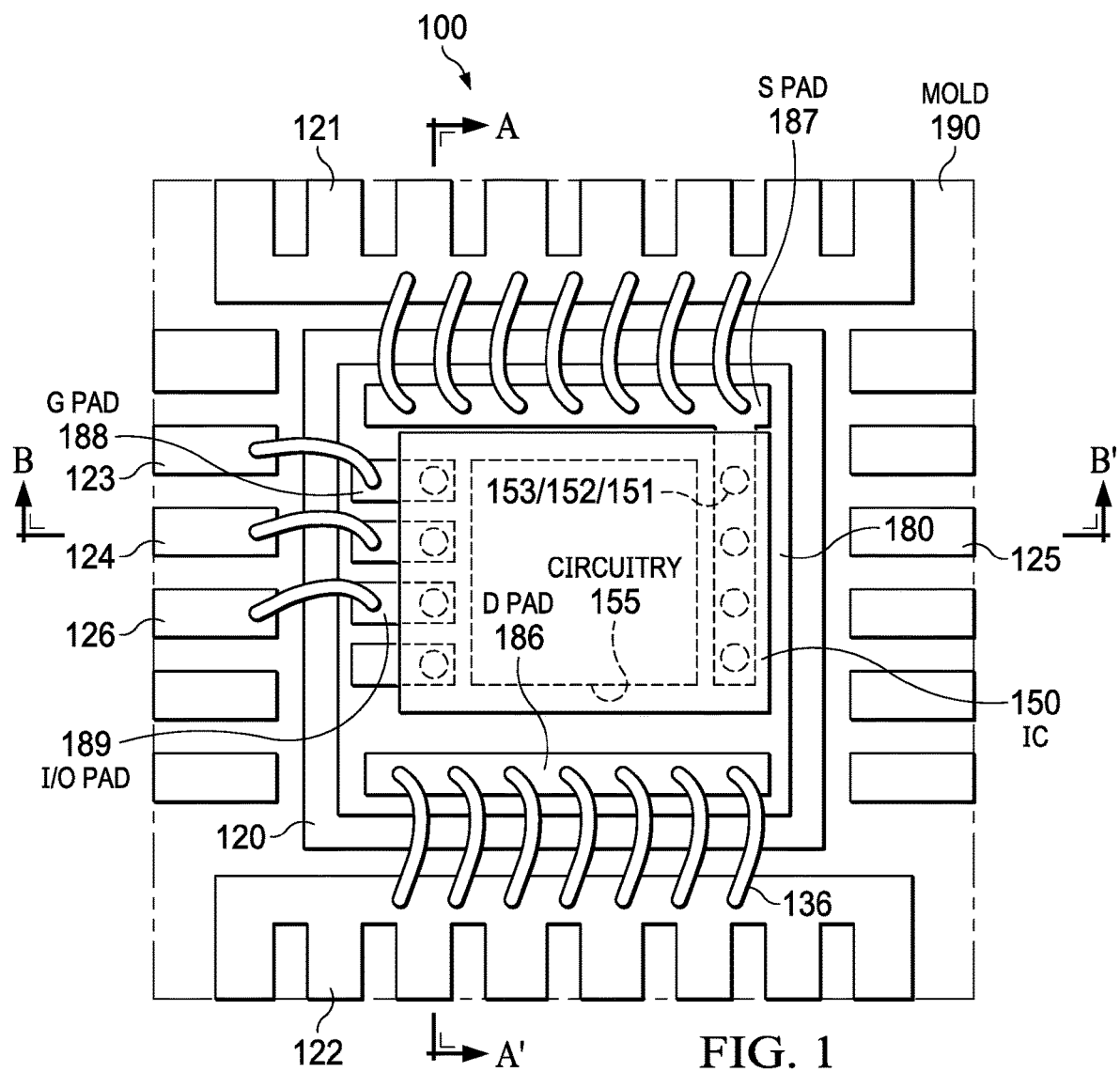
FIG. 1 is a top view depiction with the mold compound shown to reveal the top of an example stacked die semiconductor package shown as a power package with a controller IC die (e.g. gate driver IC) flip-chip mounted onto wirebond pads of an RDL(s) of a lateral FET die, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

FIG. 1 is a top view depiction with the mold compound 190 removed from the top of an example stacked die semiconductor package shown as a power package 100 with a top die 150 flip-chip mounted onto wirebond pads of an RDL(s) of a bottom die 180. Mounting a top die 150 shown as an "IC" such as a control IC on a bottom die 180 such as lateral FET is known to require additional metal layer(s) to avoid electrical shorting by the control IC back side as the active side of the bottom die 180 can be at multiple electrical potentials. Disclosed aspects apply RDL(s) on the wafer level in the wafer fab before wafer singulation that provides a wirebond pattern to enable flip-chip mounting a top die 150 such as a control IC die on a bottom die 180 such as a lateral FET die. This arrangement removes the need for wirebonds between the top die 150 and bottom die 180, as well as removes the parasitic inductance from the bondwires between the die that is particularly advantageous for high switching frequency applications.

The RDL is shown providing a wirebond pad 186 shown as a drain (D) pad, a wirebond pad 187 shown as a source (S) pad, and a wirebond pad 188 shown as a gate (G) pad. A RDL is known to be an extra metal layer on top of the top metal level of the die, where the top metal level of the die provides the I/O pads for the die that are available for bonding out other locations as wirebond pads which are also known as bump pads. A RDL in flip-chip designs is useful to redistribute IO pads to wirebond pads without changing the IO pad placement. However, even with a single RDL traditional routing capacity may be insufficient to handle sizable designs, in which the RDL may be very congested especially when there is a less-than-optimal IO-bump assignment. As a result, the routing may not be possible to be completed with a single RDL even with manual circuit design routing.

A RDL is known to be a process that generally involves one or two layers of metal and two or three layers of a generally polymer dielectric material such as polyimide or benzocyclobutene polymer (BCB) between the RDLs in the bottom most RDL and the top metal level of the die that it is on top of. For disclosed embodiments, the RDL(s) is used to move the bond pads 181 of the bottom die 180 to wirebond pads 186-188 that are in a position to enable flip-chip mounting to bond pads 151 (that are coupled to circuitry 155) on the top die 150 shown having bonding features 153/152 on the bond pads 151, and for enabling more convenient subsequent wire bonding. Feature 153 can be solder and feature 152 can be copper pillars.

In the case of a power package the top die 150 can comprise a controller and gate driver IC and the bottom die 180 can comprise a lateral FET die as shown that has source, drain and gate terminals. The lateral FET die can comprise a GaN device, or a silicon-based laterally diffused MOS (LDMOS) device, that each have gate, drain, source pads on a top side of the die. As noted in the art of power electronics a controller and gate driver IC is a circuit used for a power electronic device for converting logic level control signals (typically from the controller IC) into the appropriate voltages for switching the active power semiconductor devices of the power electronic device, such as a power MOSFET(s), and in typical applications, to provide voltage isolation so that the logic signals are not connected to the potentially dangerous high voltage on the power circuit. For example, the controller and gate driver may provide driving for a high-side gate and a low-side gate with a variable gate driving voltage provided that may range from 2.5V to 10V.

The leadframe shown is a quad-flat pack no-leads (QFN)-type leadframe including a die pad 120, a multi-lead lead terminal 121, a multi-lead lead terminal 122, and I/O lead terminals shown as 123 and 124, and other lead terminals 125 provided by the leadframe that are not shown bonded to by bond wires 136 that are used for connections on the power package 100, including between the wirebond pad 186 shown as a D pad and multi-lead lead terminal 122, S pad 187 and multi-lead lead terminal 121, between G pad 188 and lead terminal 123, and between the I/O pad 189 and lead terminal 125. The back side of the bottom die 180 is die attached by a die attach material 177 to the die pad 120. For power applications the die attach material 177 generally comprises a thermally conductive die attach material that provides a 25° C. thermal conductivity of at least 10 W/m·K, such as a silver filled epoxy or a solder material that also provides significant electrical conductivity. For non-power power applications, the die attach material 177 may be a non-thermally conductive die attach material.

Figure 2A:
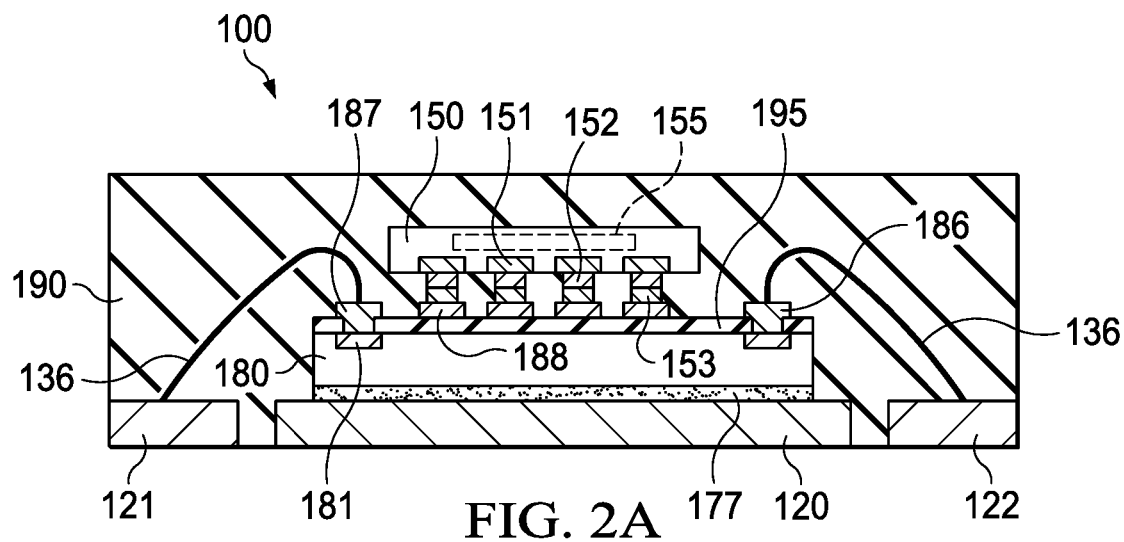
FIG. 2A is a cross sectional view of the power package shown in FIG. 1 taken along a first cut-line shown as A-A' in FIG. 1.
Figure 2B:
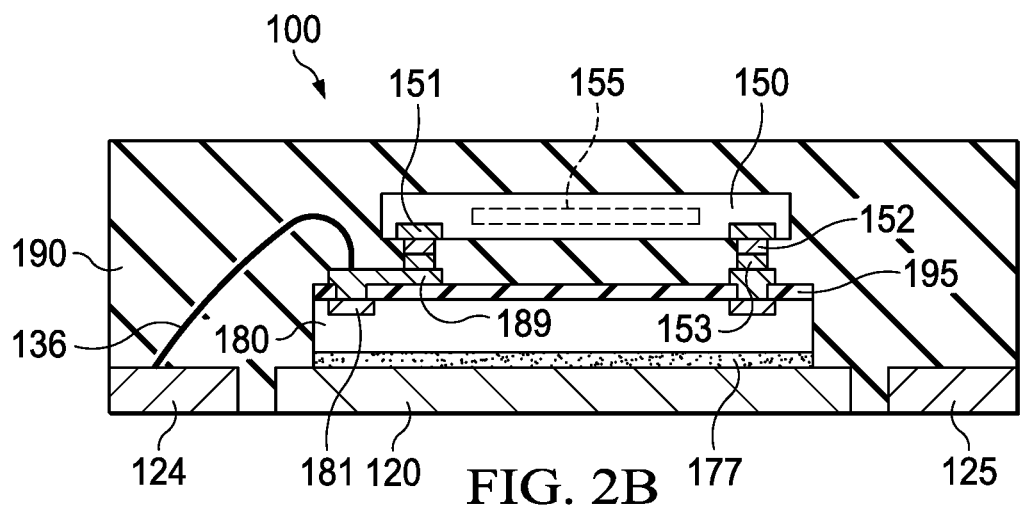
FIG. 2B is a cross sectional view of the power package shown in FIG. 1 taken along a second cut-line that is perpendicular to the first cut-line shown in FIG. 1 as B-B'.

FIG. 2A is a cross sectional view of the power package 100 shown in FIG. 1 taken along a first cut-line shown as A-A'. FIG. 2B is a cross sectional view of the power package 100 shown in FIG. 1 taken along a second cut-line that is perpendicular to the first cut-line shown in FIG. 1 shown as B-B'. FIGS. 2A and 2B clearly show the bond pads 151 of the top die 150 having pillars 152 with solder 153 caps thereon that are flip-chip mounted to wirebond pads of the RDL. FIGS. 2A and 2B also show the dielectric layer 195 that generally comprises a polymer dielectric layer that is between the top side of the bottom die 180 and the RDL.

Figure 3A:
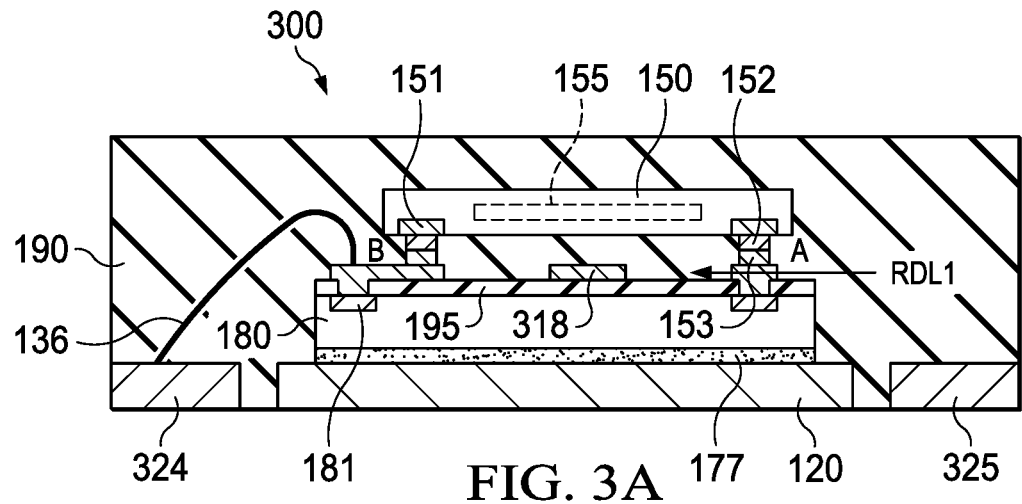
FIG. 3A shows example stacked die semiconductor package that has a bottom die that includes a single RDL which requires an RDL connection to be made between a node shown as node A and another node shown as node B, but the connection between node A and B is prevented by an obstacle shown as an obstacle layer in the way of an RDL connection from node A to node B.

FIG. 3A shows an example stacked die semiconductor package 300 that has a bottom die that includes a single RDL which requires an RDL connection to be made between nodes shown as node A and node B, but the connection between node A and node B is prevented by an obstacle shown as an obstacle layer 318 in the way of an RDL connection from node A to node B. For example, the obstacle layer 318 can be a metal trace on the bottom die 180 that under normal circuit operation is operated with a different electrical potential with respect to both the potential at node A and the potential at node B. Lead terminals are shown as 324 and 325.

Figure 3B:
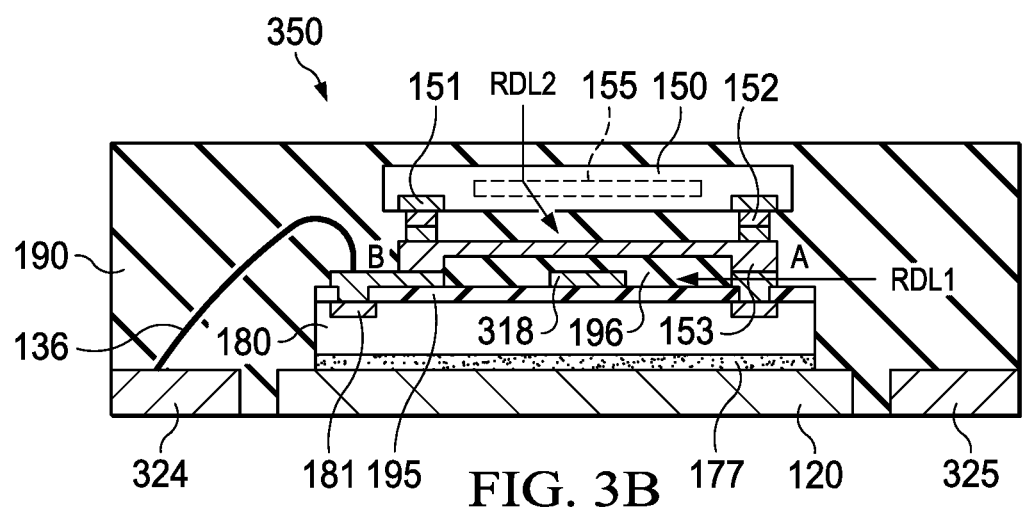
FIG. 3B shows an example stacked die semiconductor package that has a bottom die that includes a two layer RDL comprising a first RDL and a second RDL, where the bottom die as with the packaged device shown in FIG. 3A requires a connection to be made between node A and node B, where the two RDL's provides a connection between node A and node B despite the obstacle.

FIG. 3B shows an example stacked die semiconductor package 350 that has a bottom die that includes a two-layer RDL comprising a first RDL, a second dielectric layer 196 over the first RDL, and a second RDL over the second dielectric layer 196, where the bottom die 180 as with the packaged device shown in FIG. 3A needs a connection to be made between node A and node B. Here two RDLs shown provide a connection between node A and node B despite the obstacle layer 318. Lead terminals are again shown as 324 and 325.

Advantages of disclosed aspects as noted above include enabling stacked die packages such as for power stage products that provides a power density improvement, where die-to-die interconnection is made by flip-chip bump and RDL(s) which helps to reduce parasitic inductance and reduces voltage/current ringing during operation. Disclosed aspects help to reduce packaging cost by reducing wire count and package size.

Disclosed aspects can be integrated into a variety of assembly flows to form a variety of different stacked die semiconductor packages. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. A stacked die semiconductor package, comprising:
   a leadframe including a die pad and lead terminals on at least two sides of the die pad;
   a top die having circuitry coupled to bond pads;
   a bottom die having a back side that is attached by die attach material to the die pad and a top side having at least one multi-layer redistribution layer (RDL) over and coupled to a top metal level including connections to input/output (TO) nodes on the top metal level, the RDL providing a metal pattern including wirebond pads that match locations of the bond pads of the top die,
   wherein the bond pads on the top die are flip-chip attached to the wirebond pads of the bottom die, and
   bond wires positioned between the wirebond pads and the lead terminals.

2. A stacked die semiconductor package, comprising:
   a leadframe including a die pad and lead terminals on at least two sides of the die pad;
   a top die having circuitry coupled to bond pads, wherein the top die comprises a controller and gate driver;

a bottom die having a back side that is attached by die attach material to the die pad and a top side having at least one redistribution layer (RDL) over and coupled to a top metal level including connections to input/output (TO) nodes on the top metal level, the RDL providing a metal pattern including wirebond pads that match locations of the bond pads of the top die, wherein the bond pads on the top die are flip-chip attached to the wirebond pads of the bottom die, and bond wires positioned between the wirebond pads and the lead terminals.

3. The stacked die semiconductor package of claim 2, wherein the bottom die comprises a lateral field effect transistor (FET) die and wherein the die attach material comprises a thermally conductive die attach material.

4. The stacked die semiconductor package of claim 3, wherein the die pad comprises an exposed die pad.

5. The stacked die semiconductor package of claim 1, further comprising a mold compound providing encapsulation for the stacked die semiconductor package except for at least exposed bottom surfaces of the lead terminals.

6. The stacked die semiconductor package of claim 1, wherein the bond pads further include solder capped pillars thereon.

7. A stacked die semiconductor package, comprising:
a leadframe including a die pad and lead terminals on at least two sides of the die pad;
a top die having circuitry coupled to bond pads, wherein the top die comprises a controller and gate driver;
a bottom die having a back side that is attached by die attach material to the die pad and a top side having at least one redistribution layer (RDL) over and coupled to a top metal level including connections to input/output (TO) nodes on the top metal level, the RDL providing a metal pattern including wirebond pads that match locations of the bond pads of the top die, wherein the bottom die comprises a lateral field effect transistor (FET) die, wherein the die attach material comprises a thermally conductive die attach material, and wherein the lateral FET comprises a gallium nitride high-electron-mobility transistor (HEMT) or a laterally diffused MOS (LDMOS) transistor, and wherein the wirebond pads comprise a source wirebond pad and a drain wirebond pad,
wherein the bond pads on the top die are flip-chip attached to the wirebond pads of the bottom die, and
bond wires positioned between the wirebond pads and the lead terminals.

8. The stacked die semiconductor package of claim 7, wherein the lead terminals are on 4 sides of the die pad, and wherein the lead terminals include a first multi-lead with a plurality of the bond wires between the source wirebond pad and the first multi-lead, and a second multi-lead with a plurality of the bond wires between a drain wirebond pad and the second multi-lead.

9. A method of forming a stacked die semiconductor package, comprising:
providing a leadframe including a die pad and lead terminals on at least two sides of the die pad;
attaching a back side of a bottom die to the die pad with a die attach material; wherein a top side of the bottom die includes circuitry coupled to input/output (TO) nodes on a top metal level and at least one redistribution layer (RDL) over including wirebond pads coupled the TO nodes, wherein the wirebond pads match locations of bond pads on a top side of a top die, wherein the top die comprises a controller and gate driver die;

flip-chip attaching the top die to the wirebond pads on the top side of the bottom die to form a die stack; and
forming bond wires between the wirebond pads and the lead terminals.

10. The method of claim 9, further comprising molding to form a mold compound providing encapsulation for the stacked die semiconductor package except for at least exposed bottom surfaces of the lead terminals.

11. The method of claim 9, wherein the bottom die comprises a lateral field effect transistor (FET), and wherein the die attach material comprises a thermally conductive die attach material.

12. A method of forming a stacked die semiconductor package, comprising:
providing a leadframe including a die pad and lead terminals on at least two sides of the die pad;
attaching a back side of a bottom die to the die pad with a die attach material; wherein a top side of the bottom die includes circuitry coupled to input/output (TO) nodes on a top metal level and at least one redistribution layer (RDL) over including wirebond pads coupled the IO nodes, wherein the wirebond pads match locations of bond pads on a top side of a top die, wherein the top die comprises a controller and gate driver die, wherein the bottom die comprises a lateral field effect transistor (FET), wherein the die attach material comprises a thermally conductive die attach material;
flip-chip attaching the top die to the wirebond pads on the top side of the bottom die to form a die stack, and wherein the lateral FET comprises a gallium nitride (GaN) high-electron-mobility transistor (HEMT) or a laterally diffused MOS (LDMOS) transistor, and wherein the wirebond pads comprise a source wirebond pad and a drain wirebond pad; and
forming bond wires between the wirebond pads and the lead terminals.

13. The method of claim 12, wherein the lead terminals are on 4 sides of the die pad, and wherein the lead terminals include a first multi-lead with a plurality of the bond wires between the source wirebond pad and the first multi-lead, and a second multi-lead with a plurality of the bond wires between a drain wirebond pad and the second multi-lead.

14. The method of claim 9, further comprising forming solder capped pillars on the bond pads.

15. The method of claim 9, wherein the RDL comprises a multi-level RDL.

16. A stacked die semiconductor package, comprising:
a leadframe including a die pad and lead terminals on at least two sides of the die pad;
a top die comprising a controller and gate driver die having circuitry coupled to bond pads;
a bottom die comprising a lateral field effect transistor (FET) die, having a back side that is attached by a thermally conductive die attach material to the die pad and a top side having at least one redistribution layer (RDL) over and coupled to a top metal level including connections to input/output (TO) nodes on the top metal level, the RDL providing a metal pattern including wirebond pads that match locations of the bond pads of the top die,
wherein the bond pads on the top die are flip-chip attached to the wirebond pads of the bottom die, and
bond wires positioned between the wirebond pads and the lead terminals.

17. A stacked die semiconductor package, comprising:
a leadframe including a die pad and lead terminals on at least two sides of the die pad;

a top die comprising a controller and gate driver die having circuitry coupled to bond pads;

a bottom die comprising a lateral field effect transistor (FET) die, having a back side that is attached by a thermally conductive die attach material to the die pad and a top side having at least one redistribution layer (RDL) over and coupled to a top metal level including connections to input/output (TO) nodes on the top metal level, the RDL providing a metal pattern including wirebond pads that match locations of the bond pads of the top die, wherein the lateral FET comprises a gallium nitride (GaN) high-electron-mobility transistor (HEMT) or a laterally diffused MOS (LDMOS) transistor, and wherein the wirebond pads comprise a source wirebond pad and a drain wirebond pad;

wherein the bond pads on the top die are flip-chip attached to the wirebond pads of the bottom die; and bond wires positioned between the wirebond pads and the lead terminals.

18. A stacked die semiconductor package, comprising:

a leadframe including a die pad and lead terminals on 4 sides of the die pad, and wherein the lead terminals include a first multi-lead with a plurality of the bond wires between a source wirebond pad and the first multi-lead, and a second multi-lead with a plurality of the bond wires between a drain wirebond pad and the second multi-lead;

a top die comprising a controller and gate driver die having circuitry coupled to bond pads;

a bottom die comprising a lateral field effect transistor (FET) die, having a back side that is attached by a thermally conductive die attach material to the die pad and a top side having at least one redistribution layer (RDL) over and coupled to a top metal level including connections to input/output (TO) nodes on the top metal level, the RDL providing a metal pattern including wirebond pads that match locations of the bond pads of the top die;

wherein the bond pads on the top die are flip-chip attached to the wirebond pads of the bottom die; and bond wires positioned between the wirebond pads and the lead terminals.

19. The stacked die semiconductor package of claim 16, wherein the RDL comprises a multi-level RDL.

* * * * *